United States Patent [19]

Tanemura

[11] Patent Number: 5,493,705
[45] Date of Patent: Feb. 20, 1996

[54] TRANSMISSION CONTROL CIRCUIT FOR USE IN TDMA COMMUNICATION DEVICES

[75] Inventor: Takeshi Tanemura, Soma, Japan

[73] Assignee: Alps Electric Co., Ltd., Tokyo, Japan

[21] Appl. No.: 158,664

[22] Filed: Nov. 29, 1993

[30] Foreign Application Priority Data

Dec. 4, 1992 [JP] Japan ................................. 4-350648

[51] Int. Cl.⁶ ........................................................ H04B 1/04
[52] U.S. Cl. .......................................... 455/127; 455/126
[58] Field of Search ................................... 455/127, 126, 455/116; 330/133, 141, 281

[56] References Cited

U.S. PATENT DOCUMENTS

| | | | |
|---|---|---|---|
| 4,544,924 | 10/1985 | French | 455/127 |
| 5,101,176 | 3/1992 | Norimatsu . | |
| 5,193,223 | 3/1993 | Walczak et al. | 455/127 |
| 5,276,917 | 1/1994 | Vanhanen et al. | 455/127 |

OTHER PUBLICATIONS

Sedra/Smith, Microelectronic Circuits, 1989, 202.

*Primary Examiner*—Reinhard J. Eisenzopf
*Assistant Examiner*—Marsha D. Banks-Harold
*Attorney, Agent, or Firm*—Guy W. Shoup; Patrick T. Bever

[57] ABSTRACT

A transmission control circuit for use in a TDMA communication device controls the rise and fall characteristics of driving voltages applied to high-frequency amplifier circuits in such a way that the generation of unnecessary waves at the time of transmission can be restrained to a minimum, wherein a driving voltage ON/OFF circuit B1 outputs first and second driving voltages S1 and S2 having different rise and fall time constants, the first driving voltage S1 being supplied to a first high-frequency amplifier circuit A1, and the second driving voltage S2 to a second high-frequency amplifier circuit. The requisite rise time for the driving voltage S1, which is supplied to the first high-frequency amplifier circuit A1, is longer than the requisite rise time for the ON/OFF switching signal S2, supplied to the second high-frequency amplifier circuit A2, and the requisite fall time for the driving voltage S1 is shorter than the requisite fall time for the second ON/OFF switching signal S2, which is supplied to the second high-frequency amplifier circuit A2.

4 Claims, 4 Drawing Sheets

TRANSMISSION CONTROL CIRCUIT FOR USE IN TDMA COMMUNICATION DEVICES

BACKGROUND OF THE INVENTION

1. Field of the Invention

The present invention relates to a transmission control circuit for ON/OFF switching transmission waves in a TDMA (time division multiple access) system radio communication device, such as a portable telephone or a cordless telephone.

2. Description of the Related Art

In a TDMA communications system, the same frequency is used for both the transmission and reception signals. At the time of transmission, a modulated wave is output, and, at the time of reception, no modulated wave is output. That is, a modulated wave is ON/OFF switched for each interval of, for example, approximately 1 ms, thereby alternately repeating transmission and reception. As a means of this communications system, a transmission control circuit is used which is equipped with a driving voltage ON/OFF circuit which generates a modulated wave for both transmission and reception and ON/OFF-switches a +B voltage, which is the driving voltage for output amplification, for each interval of approximately 1 ms.

FIG. 3 shows such a conventional transmission control circuit, The transmission control circuit of FIG. 3 includes: a transmission circuit B4 consisting of high-frequency amplifier circuits A1 and A4 for amplifying a modulated wave F1; an antenna circuit A3 for switching between transmission and reception signals; a control section C for outputting an ON/OFF switching signal S; and a driving voltage ON/OFF circuit B2 for ON/OFF switching the driving voltage for the high-frequency amplifier circuits A1 and A4 on the basis of the ON/OFF switching signal S, The driving voltage ON/OFF circuit B2 includes: an input terminal 3 to which the ON/OFF switching signal S is input; an unnecessary signal short-circuiting capacitor C2 which is connected between the input terminal 3 and the ground; a resistor R2 one end of which is connected to the input terminal 3; a PNP-type transistor TR1 whose base electrode is connected to the other end of the resistor R2, whose emitter electrode is connected to a +B power source terminal BT through a protective resistor R0, and whose collector electrode is grounded; a resistor R1 connecting the emitter electrode of the transistor TR1 to an output terminal 4; and a capacitor C1 connected between the output terminal 4 and the ground. The resistor R1 and the capacitor C1 form a low-pass filter.

The transmission circuit B4 includes: an input terminal 1 to which the modulated wave F1 is input; a first high-frequency amplifier circuit A1 for amplifying the input modulated wave F1; a second high-frequency amplifier circuit A4 for amplifying the output of the first high-frequency amplifier circuit A1; and an output terminal 2 for emitting the output of the second high-frequency amplifier circuit A4. The driving voltage for the high-frequency amplifier circuits A1 and A4 is supplied from the driving voltage ON/OFF circuit B2.

Next, the operation of the driving voltage ON/OFF switching circuit B2 and of the transmission circuit B4 will be described. First, the ON/OFF switching signal S is output from the control section C to the driving voltage ON/OFF circuit B2, The ON/OFF switching signal S is a signal exhibiting a rectangular waveform in which high-level states of approximately 1 ms and low-level states of approximately 1 ms alternate with each other.

When the ON/OFF switching signal S is at the high level in the driving voltage ON/OFF circuit B2, the transistor TR1 is in the non-conducting state, and a voltage which is substantially equal to a voltage Vcc, applied to the +B power source terminal BT, is applied to the emitter electrode of the transistor, while, when the ON/OFF switching signal S is at the low level, the transistor TR1 is in the conducting state, and the voltage at the emitter electrode is approximately 0.

These emitter voltages are output to the output terminal 4 through the resistor R1 and applied to the two high-frequency amplifier circuits A1 and A4 of the transmission circuit B4 as a driving voltage S3. Thus, when the ON/OFF switching signal S is at the high level, that is, at the time of transmission, the high-frequency amplifier circuits A1 and A4 are supplied with the driving voltage S3 of approximately Vcc volts to be triggered into the operating state, and the modulated wave F1 is amplified and output to the output terminal 2. On the other hand, when the ON/OFF switching signal S is at the low level, that is, at the time of reception, the high-frequency amplifier circuits A1 and A4 are supplied with no driving voltage and are in the non-operating state, and the modulated wave F1 is not amplified and not output to the output terminal 2.

In the driving voltage ON/OFF circuit B2, the low-pass filter, which is formed by the resistor R1 and the capacitor C1, appropriately attenuates higher harmonics contained in the driving voltage S3 before adding them to the high-frequency amplifier circuits A1 and A4, thereby preventing the higher harmonics from becoming interference signals to interfere with communications between others.

Further, in the transmission circuit B4, both the first and second high-frequency amplifier circuits A1 and A4 consist of high-frequency amplifier circuits having a linear amplification characteristic and the same construction, whereby no higher harmonics are generated in the transmission circuit B4 and communications interference by higher harmonics acting as interference signals is avoided.

However, even when they are designed to be the same circuits, the two high-frequency amplifier circuits A1 and A4 may still involve some discrepancies due to a manufacturing dispersion, which may in some cases lead to generation of higher harmonics in the transmission circuit B4. For example, the case will be considered when the ON/OFF switching signal S is switched to change the device from the receiving state to the transmitting state, and the high-frequency amplifier circuits A1 and A4 are caused to rise by the driving voltage supplied thereto. If, in this condition, the rise characteristic of the high-frequency amplifier circuit A4 is such as can be represented by the solid line a in FIG. 4, and the rise characteristic of the high-frequency amplifier circuit A1 is such as can be represented by the broken line h in FIG. 4, which is steeper than the solid line a, a higher harmonic will be generated during the period T1 in which the high-frequency amplifier circuit A4 rises.

This is attributable to the fact that the modulated wave F1 output from the high-frequency amplifier circuit A1, which has risen earlier, is distorted by a non-linear amplifying action of the high-frequency amplifier circuit A4, which has not completely risen yet, with the result that a higher harmonic is generated.

Such a higher harmonic is also generated at the change from the transmitting state to the receiving state. That is, when, as shown in FIG. 4, the fall characteristic of the high-frequency amplifier circuit A4 is such as can be represented by the solid line e, and the fall characteristic of the high-frequency amplifier circuit A1 is such as can be represented by the broken line d, which is gentler than the solid line e, a higher harmonic will be generated during the period T2 in which the high-frequency amplifier circuit A4 falls, by an action similar to that at the time of rise.

Thus, when there is a difference in terms of rise and fall characteristics between the first and second high-frequency amplifier circuits A1 and A4, higher harmonics are liable to be generated at the rise and fall of these high-frequency amplifier circuits, and such higher harmonics may become interference signals to interfere with communications.

In the transmission control circuit, a lot of unnecessary waves are generated in the transmission circuit B4 at the time of rise or fall of the high-frequency amplifier circuits A1 and A4, so that the frequency band of the modulated wave is expanded at the time of transmission, with the result that mutual interference of frequencies occurs between adjacent channels (adjacent frequencies), thereby causing communications interference.

Further, in the conventional circuit configuration, it is necessary to adopt high-frequency amplifier circuits of a linear amplification characteristic for the two high-frequency amplifier circuits A1 and A4 as a means for mitigating the higher harmonics generation, which causes generation of unnecessary waves, resulting in a large current consumption. Thus, when driven with a battery, the transmission control circuit can operate for only a short period of time, so that it is not suited to be mounted on a small size portable communication device or the like.

SUMMARY OF THE INVENTION

In view of the above problems, the present invention aims to mitigate the generation of unnecessary waves. It is accordingly an object of the present invention to provide a transmission control circuit for use in TDMA communication devices which is capable of restraining to the generation of unnecessary waves attributable to a variation in the rise and fall characteristics of the first and second high-frequency amplifier circuits to a minimum at the switching between transmission and reception.

In accordance with the present invention, there is provided a transmission control circuit for use in a TDMA communication device, comprising: a first high-frequency amplifier circuit for amplifying a modulated wave; a second high-frequency amplifier circuit for amplifying the output of the first high-frequency amplifier circuit; and a driving voltage ON/OFF circuit for effecting ON/OFF switching between first and second driving voltages on the basis of an input ON/OFF switching signal to supply the first driving voltage to the first high-frequency amplifier circuit and the second driving voltage to the second high-frequency amplifier circuit, wherein the first driving voltage is set such that it requires a longer time for its rise than the second driving voltage, and requires a shorter time for its fall than the second driving voltage. In the transmission control circuit for use in TDHA communication devices as claimed in claim 3, the second high-frequency amplifier circuit is further endowed with a non-linear amplification characteristic.

The above-mentioned means operate in the following manner: the driving voltage ON/OFF circuit generates first and second driving voltages requiring different rise and fall times on the basis of the input ON/OFF switching signal, and separately drives the first and second high-frequency amplifier circuits with the first and second driving voltages, respectively. The first high-frequency amplifier circuit is driven in such a way that it rises later than the second high-frequency amplifier circuit, and falls earlier than the second high-frequency amplifier circuit, whereby the generation of higher harmonics attributable to a variation in the rise and fall characteristics of the first and second high-frequency amplifier circuits is restrained to a minimum.

DETAILED DESCRIPTION OF THE PREFERRED EMBODIMENT

Figure 1:
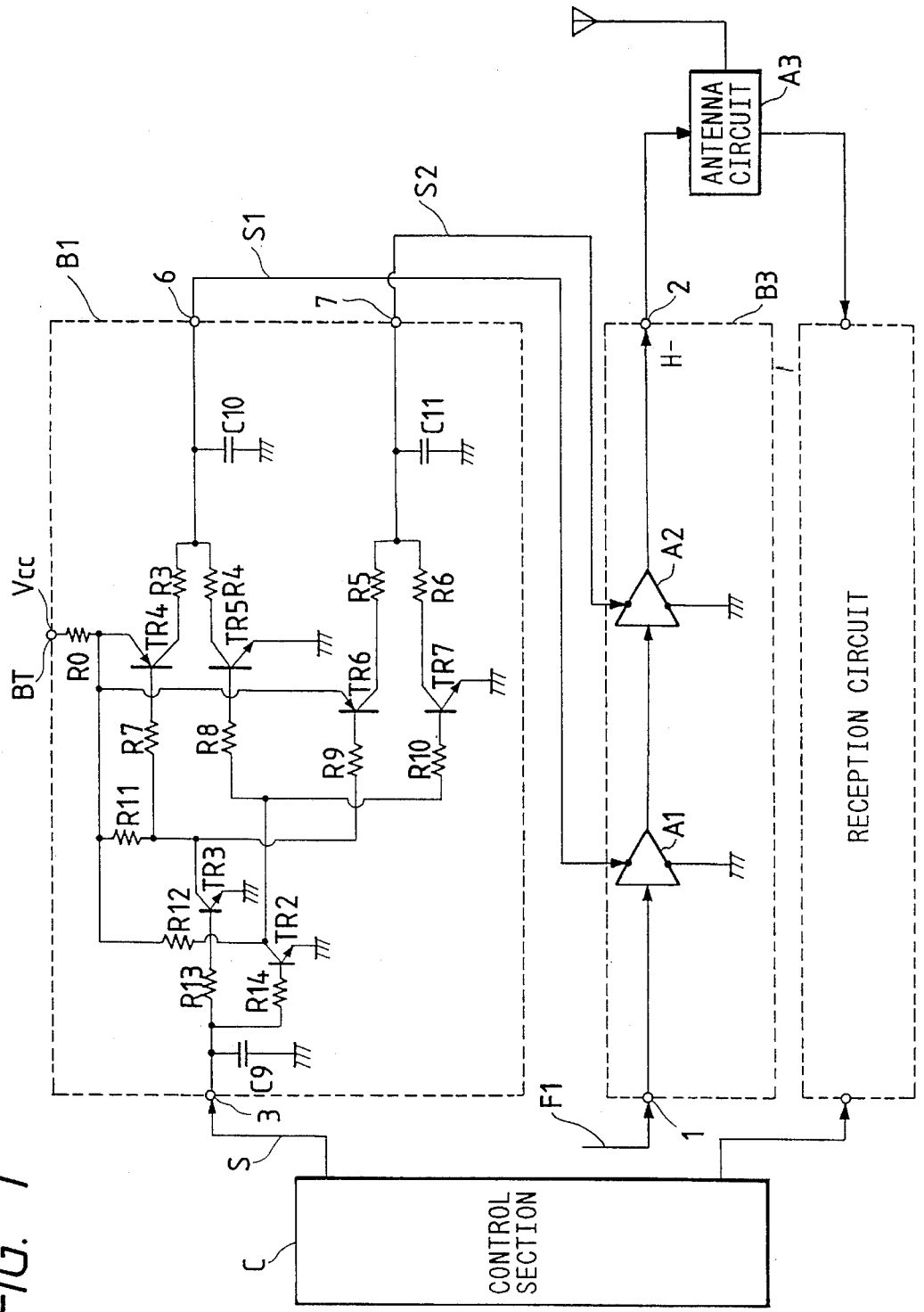
FIG. 1 is a circuit diagram showing the construction of a transmission control oil-cult for use in TDMA communication devices according to an embodiment of the present invention.

The present invention will now be described with reference to the drawings. FIG. 1 shows an embodiment of the present invention. First, its construction will be schematically described. This transmission control circuit includes: a control section C for outputting an ON/OFF switching signal S; a driving voltage ON/OFF circuit B1 for effecting ON/OFF switching of driving voltages on the basis of the ON/OFF switching signal S; a transmission circuit B3 for amplifying a modulated wave F1; and an antenna circuit A3.

The driving voltage ON/OFF circuit B1 is composed of an input terminal 3, transistors TR2 through TR7, resistors R0 and R3 through R14, capacitors C9 through C11, and two output terminals 6 and 7.

This transmission control circuit will be described in more detail. The capacitor C9 for short-circuiting unnecessary signals is connected between the input terminal 3 and the ground. Further, one end of each of two resistors R13 and R14 is connected to the input terminal 3. The transistor TR3 is an NPN-type transistor whose base electrode is connected to the other end of the resistor R13 and whose emitter electrode is grounded. Similarly, the transistor TR2 is an NPN-type transistor whose base electrode is connected to the other end of the resistor R14 and whose emitter electrode is grounded. The collector electrode of the transistor TR3 is connected to a +B power source terminal BT through the load resistor R11 and the resistor R0. Similarly, the collector electrode of the transistor TR2 is connected to the +B power source terminal BT through the resistor R12 and the resistor R0. The collector electrode of the transistor TR3 is further connected to the base electrode of the transistor TR4 through the resistor R7 and, at the same time, connected to the base electrode of the transistor TR6 through the resistor R9. The collector electrode of the transistor TR2 is further-connected to the base electrode of the transistor TR5 through the resistor R8 and, at the same time, connected to the base electrode of the transistor TR7 through the resistor R10.

The transistor TR4 is a PNP-type transistor whose emitter electrode is connected to the +B power source terminal BT through the resistor R0 and whose collector electrode is connected to the first output terminal 6 through the resistor R3. The transistor TR5 is an NPN-type transistor whose collector electrode is connected to the first output terminal through the resistor R4 and whose emitter electrode is grounded. The capacitor C10 is connected between the first output terminal 6 and the ground terminal. The transistor TR6 is a PNP-type transistor whose emitter electrode is connected to the +B power source terminal BT through the resistor R0 and whose collector electrode is connected to the second output terminal 7 through the resistor R5. The transistor TR7 is an NPN-type transistor whose collector electrode is connected to the second output terminal through the resistor R6 and whose emitter electrode is grounded. The capacitor C11 is connected between the second output terminal 7 and the ground terminal.

The transmission circuit 83 includes: an input terminal 1 to which the modulated wave F1 is input; a first high-frequency amplifier circuit A1 for amplifying the input modulated wave F1; a second high-frequency amplifier circuit A2 for amplifying the output of the high-frequency amplifier circuit A1; and an output terminal 2 through which the output of the second high-frequency amplifier circuit A2 is emitted. The high-frequency amplifier circuits A1 and A2 are supplied with driving voltage from the driving voltage ON/OFF circuit B1.

Next, the operation of the driving voltage ON/OFF circuit will be described. An ON/OFF switching signal S exhibiting a rectangular waveform in which high-level states of approximately 1 ms and low-level states of approximately 1 ms alternate with each other, is supplied to the input terminal 3 from the control section C. When the ON/OFF switching signal S supplied to the input terminal 3 is at the high level, the transistors TR3 and TR2 are in the conducting state, and the collector voltage is at approximately 0 volts.

When, on the other hand, the ON/OFF switching signal S is at the low level, the transistors TR3 and TR2 are in the non-conducting state, and a voltage which is close to Vcc is applied to their collector electrodes from the +B power source terminal BT. The transistors TR3 and TR2 serve as a buffer for receiving the voltage of Vcc applied to the +B power source terminal BT. The resistance values of the resistors R11 and R12 are different in order that the respective collector voltages of the two transistors may be slightly different from each other when in the non-conducting state.

Next, the operation of the transistors TR4 through TR7 will be described. First, the operation of the transistors TR4 and TR6 will be described. When the ON/OFF switching signal S is at the high level, the collector voltage of the transistor TR3 is approximately 0 volts. Since this voltage is applied to the base electrode of the transistor TR4 by the resistor RT, the transistor TR4 is in the conducting state, and a voltage which is close to Vcc appears at its collector electrode. Similarly, a voltage close to Vcc also appears at the collector electrode of the transistor TR6.

On the other hand, when the ON/OFF switching signal S is at the low level, the collector voltage of the transistor TR3 is a voltage which is close to Vcc. Since this voltage is applied to the base electrode of the transistor TR4 by the resistor R7, the transistor TR4 is in the non-conducting state. Similarly, the transistor TR6 is also in the non-conducting state.

Next, the operation of the transistors TR5 and TR7 will be described. When the ON/OFF switching signal S is at the high level, the collector voltage of the transistor TR2 is approximately 0 volts, and a voltage of approximately 0 volts is also applied to the base electrode of the transistor TR5 by the resistor RS, so that the transistor TR5 is in the non-conducting state. Similarly, the transistor TR7 is also in the non-conducting state.

When, on the other hand, the ON/OFF switching signal is at the low level, the collectors voltage of the transistor TR2 is a voltage which is close to Vcc. Since this voltage is applied to the base electrode of the transistor TR5 by the resistor 8, the transistor TR5 is in the conducting state. Similarly, the transistor TR7 is also in the conducting state.

Thus, when the ON/OFF switching signal S is at the high level, the transistors TR4 and TR6 are in the conducting state, and the transistors TR5 and TR7 are in the non-conducting state, whereas, when the ON/OFF switching signal is at the low level, the transistors TR4 and TR6 are in the non-conducting state, and the transistors TR5 and TR7 are in the conducting state.

When the transistor TR4 is in the conducting state, the transistor TR5 is in the non-conducting state, so that electric current flows through the resistor R0, the transistor TR4 and the resistor R3, and the capacitor C10 is charged. The charging time constant is mainly determined by the product of the resistance value of the resistor R3 and the capacity value of the capacitor C10, and a driving voltage S1 having a rise time corresponding to the time constant is output from the output terminal 6. When, on the other hand, the transistor TR4 is in the non-conducting state, the transistor TR5 is in the conducting state, and the charge accumulated in the capacitor C10 is discharged through the resistor R4 and the transistor TR5. The discharge time constant is determined by the product of the resistance value of the resistor R4 and the capacity value of the capacitor C10. The transistors TR6 and TR7, the resistors R5 and RG, and the capacitor C11 operate in the same manner as described above.

Thus, when the ON/OFF switching signal S is switched to the high level at the time of transmission, the high-frequency amplifier circuit A1 is supplied with a driving voltage S1 of approximately Vcc volts, whose rise time constant is set by the resistor R3 and the capacitor C10, from the output terminal 6 of the driving voltage ON/OFF circuit B1, with the result that it is triggered into the operating state. The high-frequency amplifier circuit A2 is supplied with a driving voltage 82 of approximately Vcc volts, whose rise time constant is set by the resistor R5 and the capacitor C11, from the output terminal 7, with the result that it is triggered into the operating state, and amplifies the modulated wave F1 to output it to the output terminal 2.

On the other hand, when the ON/OFF switching signal S is switched to the low level at the time of reception, the high-frequency amplifier circuit A1 is supplied with a driving voltage S1 of approximately 0 volts, whose discharge time constant is set by the resistor R3 and the capacitor C10, from the output terminal 6 of the driving voltage ON/OFF circuit B1 and is triggered into the non-operating state, whereas the high-frequency amplifier circuit A2 is supplied with a driving voltage of approximately 0 volts, whose discharge time constant is set by the resistor R5 and the capacitor C11, from the output terminal 7, and is triggered into the non-operating state, so that it does not amplify the modulated wave F1, with the result that the modulated wave F1 is not supplied to the output terminal 2.

Figure 2:
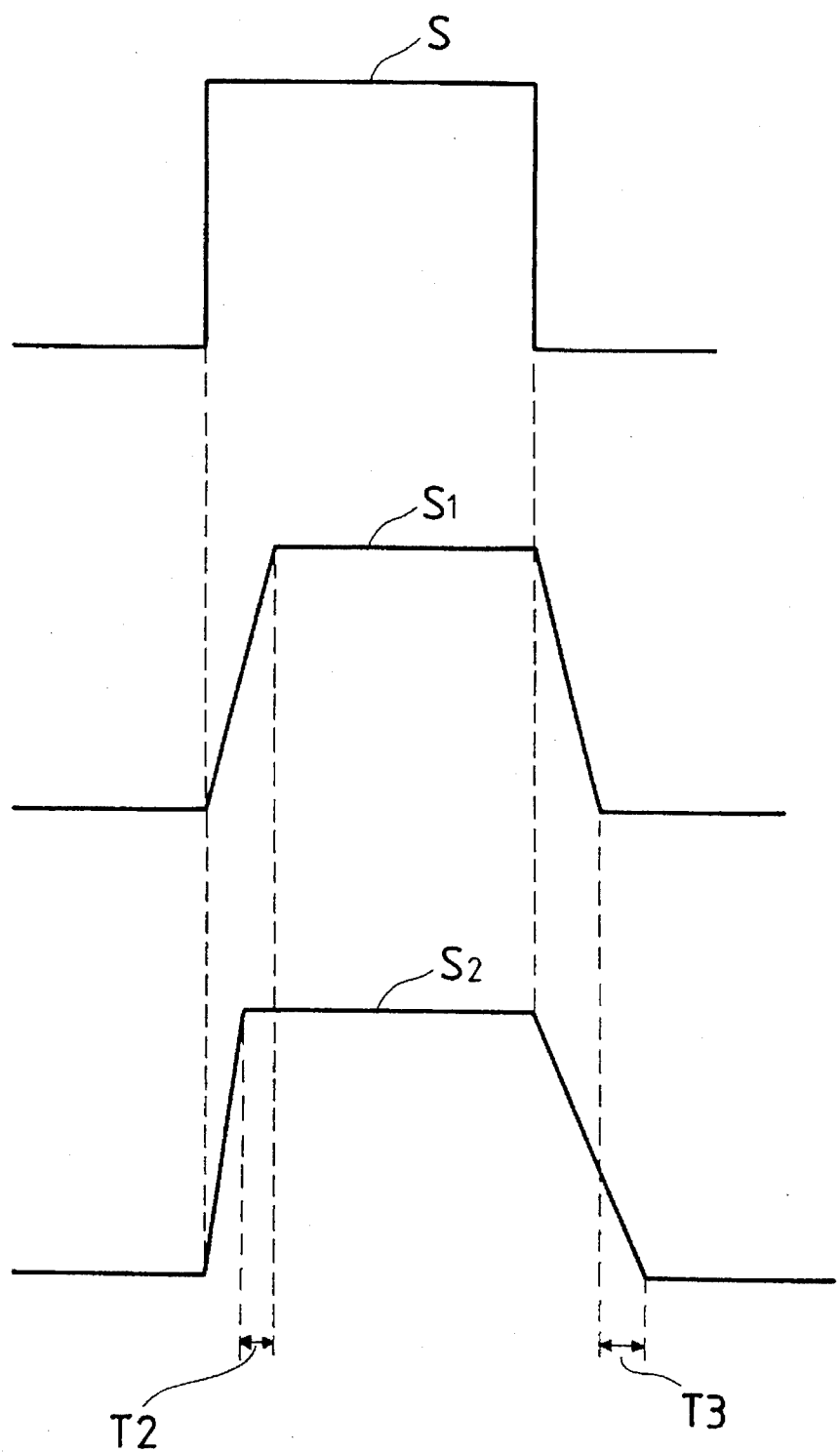
FIG. 2 is a timing chart showing the relationship between the ON/OFF switching signal and the driving voltages in the embodiment.
Figure 3:
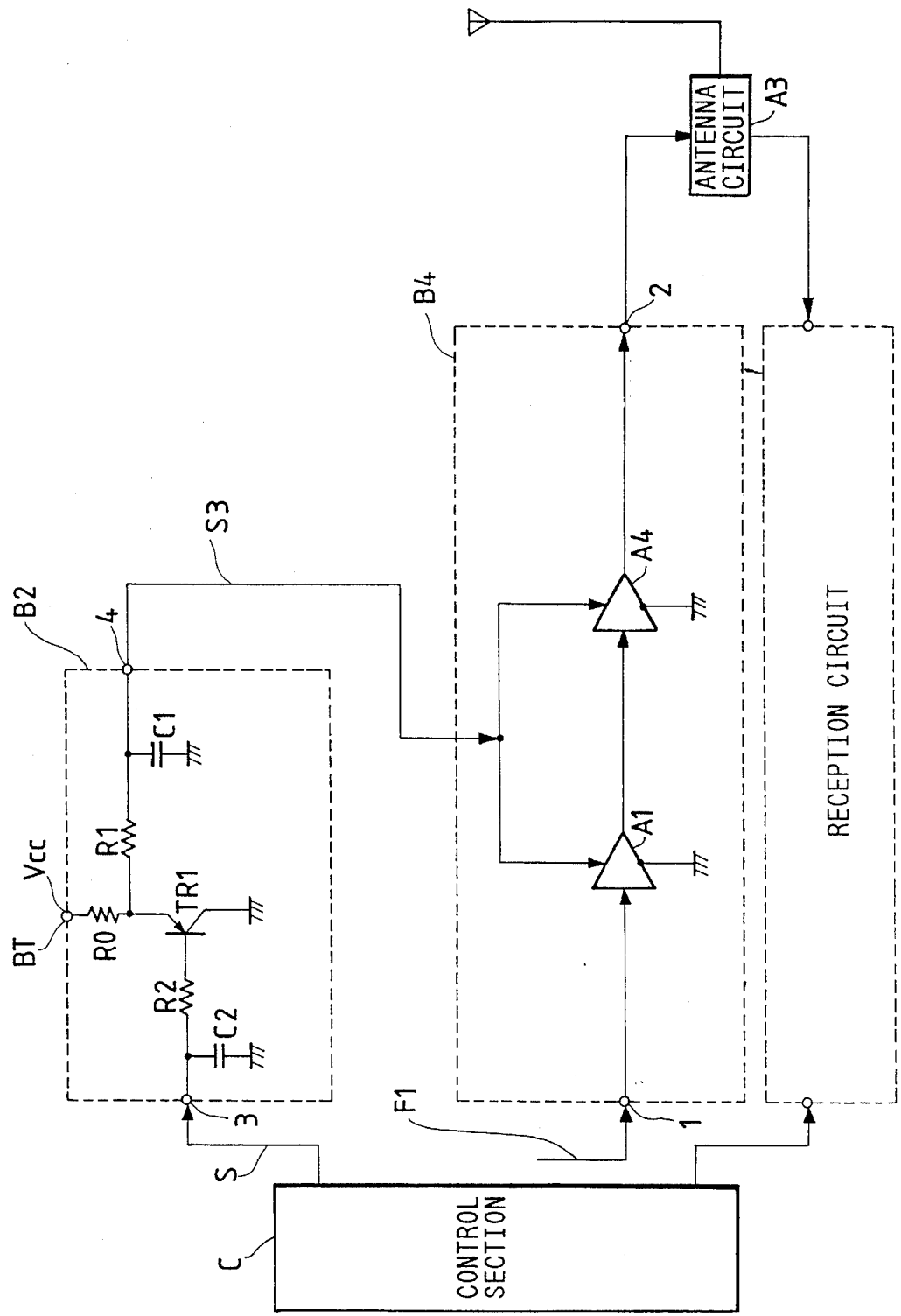
FIG. 3 is a circuit diagram showing the construction of a conventional transmission control circuit for use in TDMA communication devices.
Figure 4:
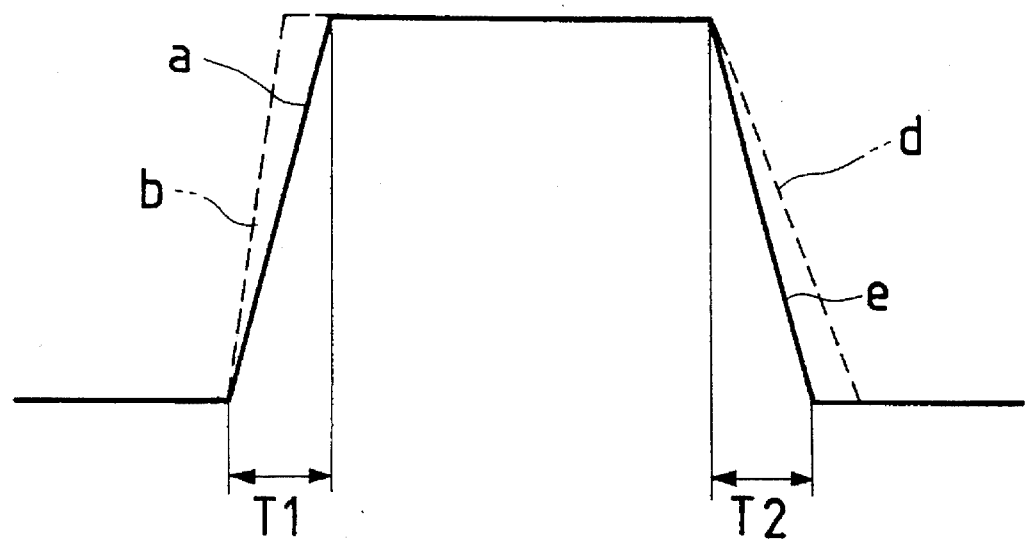
FIG. 4 is a timing chart showing the differences in the rise and fall characteristics between the two high-frequency amplifier circuits of the conventional circuit.

FIG. 2 shows the timing of the ON/OFF switching signal S and of the driving voltages S1 and S2 output from the output terminals 6 and 7 of the driving voltage ON/OFF circuit B1. In the drawing, symbol S indicates the waveform of the ON/OFF switching signal, and numerals S1 and S2 indicate the waveforms of the first and second driving voltages S1 and S2 output from the output terminals 6 and 7.

Thus, the first driving voltage S1 is set such that it requires a rise time which is longer than the requisite rise time for the second driving voltage S2 by a fixed length of time T2, and that it requires a fall time which is shorter than the requisite fall time for the second driving voltage 82 by a fixed length of time T3.

As stated above, the requisite rise and fall times of the driving voltages S1 and 82 are set by the values of the resistors R3 through R6 and the values of the capacitors C10 and C11. For example, to set the requisite rise time for the first driving voltage S1 longer than the requisite rise time for the second driving voltage S2, the capacity values of the capacitors C10 and C11 are equalized, and the resistance value of the resistor R3 is set larger than the resistance value of the resistor R5. To set the requisite fall time for the first driving voltage S1 shorter than the requisite fall time for the second driving voltage S2, the resistance value of the resistor R4 is set smaller than the resistance value of the resistor R6.

As described above, when the ON/OFF switching signal S1 is switched from the low level to the high level, the first high-frequency amplifier circuit A1 requires a longer rise time than the second high-frequency amplifier circuit A2, and, when the ON/OFF switching signal is switched from the high level to the low level, it requires a shorter fall time than the second high-frequency amplifier circuit A2. Thus, when a change from the receiving state to the transmitting state is effected, the first high-frequency amplifier circuit A1 is triggered into the operating state after the second high-frequency amplifier circuit A2 has been completely triggered into the operating state. When a change from the transmitting state to the receiving state is effected, the first high-frequency amplifier circuit A1 is triggered into the non-operating state before the second high-frequency amplifier circuit A2 has been brought to the non-operating state.

As described above, in accordance with the present invention, the first high-frequency amplifier circuit and the second high-frequency amplifier circuit are separately controlled with first and second driving voltages of different rise and fall characteristics. The requisite rise time for the first driving voltage, which is applied to the first high-frequency amplifier circuit, is set longer than the requisite rise time for the second driving voltage, which is applied to the second high-frequency amplifier circuit, and the requisite fall time for the first driving voltage is set shorter than the requisite fall time for the second driving voltage, thereby restraining the generation of unnecessary waves due to a variation in the rise and fall characteristics of the two high-frequency amplifier circuits at the time of switching of the ON/OFF switching signal.

Further, it is possible for the second high-frequency amplifier circuit to consist of a Class AB or Class C non-linear-type amplifier circuit having a different rise characteristic from that of the first high-frequency amplifier circuit. By thus using a Class AB or Class C amplifier circuit, it is possible to realize a transmission circuit whose power consumption is so small as to allow it to be operated for a long time even with a battery, thereby enabling it to be mounted on a portable communication device or the like.

What is claimed is:

1. A transmission control circuit for use in a TDMA communication device, comprising:

a first high-frequency amplifier circuit for amplifying a modulated wave;

a second high-frequency amplifier circuit for amplifying an output of said first high-frequency amplifier circuit; and a driving voltage ON/OFF circuit for generating first and second driving voltages on the basis of an input ON/OFF switching signal, said first driving voltage being supplied to said first high-frequency amplifier circuit and said second driving voltage being supplied to said second high-frequency amplifier circuit, wherein said first driving voltage includes a requisite rise time which is longer than a requisite rise time of said second driving voltage and the first driving voltage includes a requisite fall time which is shorter than a requisite fall time of said second driving voltage.

2. A transmission control circuit for use in a TDMA communication device according to claim 1, wherein said driving voltage ON/OFF circuit includes:

a first transistor of the PNP type to the base electrode of which said ON/OFF switching signal is applied, to the emitter electrode of which a power source voltage is applied, and the collector electrode of which is grounded in series through a first resistor and a first capacitor; and a second transistor of the NPN type to the base electrode of which said ON/OFF switching signal is applied, the collector electrode of which is connected through a second resistor to a node between said first resistor and said first capacitor, and the emitter electrode of which is grounded.

3. A transmission control circuit for use in a TDMA communication device according to claim 2, wherein said second high-frequency amplifier circuit has a non-linear amplification characteristic.

4. A transmission control circuit for use in a TDMA communication device according to claim 1, wherein said second high-frequency amplifier circuit has a non-linear amplification characteristic.

* * * * *